United States Patent
Lin et al.

(10) Patent No.: US 10,299,406 B2
(45) Date of Patent: May 21, 2019

(54) LIQUID COOLING HEAT SINK DEVICE

(71) Applicant: COOLER MASTER CO., LTD., New Taipei (TW)

(72) Inventors: Jen-Cheng Lin, New Taipei (TW); Shui-Fa Tsai, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 0 days.

(21) Appl. No.: 15/759,718

(22) PCT Filed: Jan. 19, 2016

(86) PCT No.: PCT/CN2016/000034
§ 371 (c)(1),
(2) Date: Mar. 13, 2018

(87) PCT Pub. No.: WO2017/124202
PCT Pub. Date: Jul. 27, 2017

(65) Prior Publication Data
US 2019/0053403 A1    Feb. 14, 2019

(51) Int. Cl.
*H05K 7/20* (2006.01)
*H01L 23/473* (2006.01)

(52) U.S. Cl.
CPC ....... *H05K 7/20336* (2013.01); *H01L 23/473* (2013.01); *H05K 7/20* (2013.01);
(Continued)

(58) Field of Classification Search
CPC .......... H05K 7/20336; H05K 7/20327; H05K 7/20409; H05K 7/20436; H05K 7/20;
(Continued)

(56) References Cited

U.S. PATENT DOCUMENTS 7,444,827 B2 * 11/2008 Lee ................. F25B 39/028
165/104.33
7,753,662 B2 * 7/2010 Lai ................. F04D 13/0606
165/80.4

(Continued)

FOREIGN PATENT DOCUMENTS

CN        204442899 U     7/2015
CN        204721777 U    10/2015

*Primary Examiner* — Steven T Sawyer
*Assistant Examiner* — Yahya Ahmad
(74) *Attorney, Agent, or Firm* — Rabin & Berdo, P.C.

(57) ABSTRACT

The present invention provides a liquid cooling heat sink device for cooling a heat source. The liquid cooling heat sink device includes a heat conduction module, a liquid supply module, and a liquid guiding module. The heat conduction module includes a vapor chamber and at least one heat conducting column. The vapor chamber has at least one space and one side of the vapor chamber contacts the heat source. The heat conducting column is mounted on one side of the vapor chamber, and the side of the vapor chamber is distal from the heat source. The liquid supply module is mounted on one side of the vapor chamber and has a casing and a pump. The casing has a liquid entrance terminal and a liquid exit terminal out of the casing. The liquid guiding module is mounted on one side of the vapor chamber and a receiving space is formed between the vapor chamber and the liquid guiding module. The liquid supply module communicates with the receiving space for guiding a coolant to the receiving space and discharges the coolant through the liquid exit terminal. Therefore the heat sink device forms multiple cooling circulating paths for enhancing heat sink efficiency.

17 Claims, 11 Drawing Sheets

(52) U.S. Cl.
CPC ..... *H05K 7/20327* (2013.01); *H05K 7/20409* (2013.01); *H05K 7/20436* (2013.01)

(58) Field of Classification Search
CPC ........... H05K 7/20218; H05K 7/20254; H05K 7/20272; H01L 23/473
See application file for complete search history.

(56) References Cited

U.S. PATENT DOCUMENTS

| | | | | |
|---|---|---|---|---|
| 8,051,898 | B2* | 11/2011 | Chiang | H01L 23/473 165/104.28 |
| 9,057,567 | B2* | 6/2015 | Lyon | F28D 15/00 |
| 2005/0183848 | A1* | 8/2005 | Cheng | F28F 3/12 165/104.33 |
| 2006/0021737 | A1* | 2/2006 | Lee | F28D 15/00 165/80.4 |
| 2008/0053641 | A1* | 3/2008 | Lai | H01L 23/4006 165/120 |
| 2008/0104992 | A1* | 5/2008 | Lai | H01L 23/473 62/435 |
| 2008/0295534 | A1* | 12/2008 | Farrow | F04C 18/086 62/259.2 |
| 2009/0074595 | A1* | 3/2009 | Chen | F04B 19/006 417/413.2 |
| 2009/0159244 | A1* | 6/2009 | Mounioloux | F04D 29/586 165/104.33 |
| 2011/0100612 | A1* | 5/2011 | Tang | G06F 1/20 165/104.33 |
| 2016/0338223 | A1* | 11/2016 | Tsai | F28F 1/00 |
| 2017/0268828 | A1* | 9/2017 | Lin | F28D 15/02 |

* cited by examiner

LIQUID COOLING HEAT SINK DEVICE

FIELD OF THE INVENTION

The present invention relates to a liquid cooling heat sink device, especially to a heat sink device that enhances the heat sink efficiency via liquid circulating and cooling.

BACKGROUND OF THE INVENTION

With the advance of Central Processing Unit, i.e. CPU, processing velocity and efficiency are improved, and heat generated by the CPU is also increased. Power consumption during operation of the CPU is increased along with higher operating frequency, and high temperature may decrease the durability of the CPU. Especially, when the overabundance heat cannot be removed, the whole system may become instable. To solve the problem that CPU is prone to overheat, a conventional method for removing the heat is using an assembly of a heat sink and a fan, thereby removing the heat through a forced cooling way so that the CPU can operate normally. However, the conventional fan operating at a high speed may generate annoying noise and consume a lot of power, which is hard to overcome by manufacturers.

However, in one of conventional liquid cooling heat sink devices, except for a heat sink or a vapor chamber which contacts the heat source for conducting heat generated by the heat source, a cover or other components are made of plastic, so an overall heat sink efficiency may not be enhanced. In view of this, the inventor of the present invention has made intensive efforts and devoted himself to studying and combining theory and practice to solve the above-mentioned problems with the object of improvement in view of the above-mentioned prior art.

SUMMARY OF THE INVENTION

The main objective of the present invention is to provide a liquid cooling heat sink device having a structure that has a vapor chamber and a heat conducting column mounted with a water block for increasing the overall heat sink efficiency.

For the above-mentioned objective, the present invention provides a liquid cooling heat sink device for cooling a heat source and is characterized in that the liquid cooling heat sink device includes a heat conduction module, a liquid guiding module and a liquid supply module, wherein:
the heat conduction module includes:
  a vapor chamber comprising at least one space; one side of the vapor chamber contacting the heat source;
  a working fluid flowing in the space; and
  at least one heat conducting column mounted on another side of the vapor chamber and said another side of the vapor chamber being distal from the heat source;
the liquid supply module is mounted on one side of the vapor chamber; the liquid supply module includes:
  a casing comprising:
    a liquid entrance terminal and a liquid exit terminal out of the casing; and
  a pump;
the liquid guiding module is mounted on one side of the vapor chamber and forming:
  a receiving space between the liquid guiding module and the vapor chamber;

wherein the liquid supply module communicates with the receiving space for conducting a coolant to the receiving space and discharging the coolant via the liquid exit terminal.

In the liquid cooling heat sink device, there are multiple heat conducting columns, and the multiple heat conducting columns are parallel and separate from one another uprightly or staggered and separate from one another uprightly.

In the liquid cooling heat sink device, the heat conducting columns are solid columns.

In the liquid cooling heat sink device, the heat conducting columns are heat pipes extending from one side of the vapor chamber; each one of the heat pipes comprises:
  a chamber communicating with the space of the vapor chamber and forming:
    a capillary layer on a wall of the chamber.

In the liquid cooling heat sink device, a capillary layer on a wall of the space and the capillary layer on the wall of the chamber are connected with each other.

In the liquid cooling heat sink device, the capillary layer is selected from the group consisting of a mesh structure, a fiber texture, a sintered powder structure, and a groove structure.

In the liquid cooling heat sink device, a plurality of fins is mounted to the heat conducting column.

In the liquid cooling heat sink device, a material of each one of the fins includes at least aluminum, copper, or graphite.

In the liquid cooling heat sink device, the fins are serially connected and fixed on the heat conducting column and each one of the fins comprises:
  a slot.

In the liquid cooling heat sink device, each one of the fins is a slice formed on an outer wall of the heat conducting column and extending outward from the outer wall of the heat conducting column.

In the liquid cooling heat sink device, the liquid entrance terminal and the liquid exit terminal are located on the same side of the casing.

In the liquid cooling heat sink device, the liquid entrance terminal and the liquid exit terminal are connected to an external circulating outlet and a circulating inlet of a condenser, and thereby a cooling circulation is formed.

In the liquid cooling heat sink device, the liquid guiding plate comprises:
  a plurality of top columns engaged on one side of the liquid guiding plate, and said side of the liquid guiding plate is adjacent to one side of the diversion plate; each one of the top columns is a solid round column, a solid cone, a solid rectangular prism, a solid polygonal pyramid, a solid polygonal prism, a hollow round column, a hollow cone, a hollow rectangular prism, a hollow polygonal pyramid, or a hollow polygonal prism.

In the liquid cooling heat sink device, outer diameters of the top columns are equal or unequal.

In the liquid cooling heat sink device, materials of the vapor chamber, the heat conducting column, the liquid guiding plate, and the diversion plate include at least aluminum, copper, or graphite.

In the liquid cooling heat sink device:
  the liquid guiding module includes a liquid guiding plate and a diversion plate;
  the diversion plate is mounted between the liquid guiding plate and the vapor chamber and covers the heat conducting column;

a receiving space is formed between a side of the vapor chamber and the diversion plate, said side of the vapor chamber being distal from the heat source;

a first conducting space is formed between the liquid guiding plate and the casing;

a second conducting space is formed between the diversion plate and the liquid guiding plate;

wherein the liquid entrance terminal, the first conducting space, the second conducting space, the receiving space, and the liquid exit terminal communicate with one another.

In the liquid cooling heat sink device, the liquid cooling heat sink device further includes:

a confluence plate engaged on one side of the diversion plate, said side of the diversion plate adjacent to the vapor chamber and comprising:
  a confluence opening communicating with the receiving space.

Compared to the prior art, the liquid cooling heat sink device of the present invention comprises the following advantages: with the heat sink module, the liquid guiding module, and the liquid supply module, heat is conducted or convected to the vapor chamber, the heat conducting column, the fins, the diversion plate, and the liquid guiding plate, and the pump guides a circulating coolant for heat exchange and bringing the heat to the outside, and the heat sink device comprises multiple cooling circulating paths, so the overall heat sink efficiency of the liquid cooling heat sink device is enhanced.

REFERENCE NUMERALS IN THE DRAWINGS

M1—liquid cooling heat sink device; M2—condenser; M21—circulating outlet; M22—circulating inlet; 1—heat conduction module; 2—liquid guiding module; 3—liquid supply module; 10—vapor chamber; 11—flange; 12—capillary layer; 20—heat conducting column; 20a, 20b, 20c, 20d—heat pipe; 201a, 201b, 201c, 201d—chamber; 210a, 210b, 210c, 210d—capillary layer; 30—diversion plate; 30A—cavity portion; 30S—cover portion; 30W—wall portion; 301—first branch opening; 302—second branch opening; 31—confluence plate; 31A—protrusion; 311—confluence opening; 40—liquid guiding plate; 40S—top plate; 401—first conducting opening; 402—second conducting opening; 41—top column; 50—pump; 51—stator; 52—rotor; 60—casing; 61—liquid entrance terminal; 62—liquid exit terminal; 90, 90a, 90b, 90c—fins; 901—slot; 902a, 902b—hole; 100—shell; H—heat source; H1—thermal convection; L1—coolant; L2—heated coolant; R10—space; R20—first conducting space; R30—second conducting space; R40—receiving space; S1—heated surface; S2—heat-dissipating surface; W—working fluid.

DETAILED DESCRIPTION OF THE PREFERRED EMBODIMENTS

The detailed descriptions and technical contents of the present invention will be described below with reference to the drawings, wherein the drawings are provided for the purpose of illustration and description only and are not intended to limit the invention.

Please refer to FIGS. 1 to 3, 7, and 8. The invention provides a liquid cooling heat sink device M1 comprising a heat conduction module 1, a liquid guiding module 2, and a liquid supply module 3.

Figure 1:
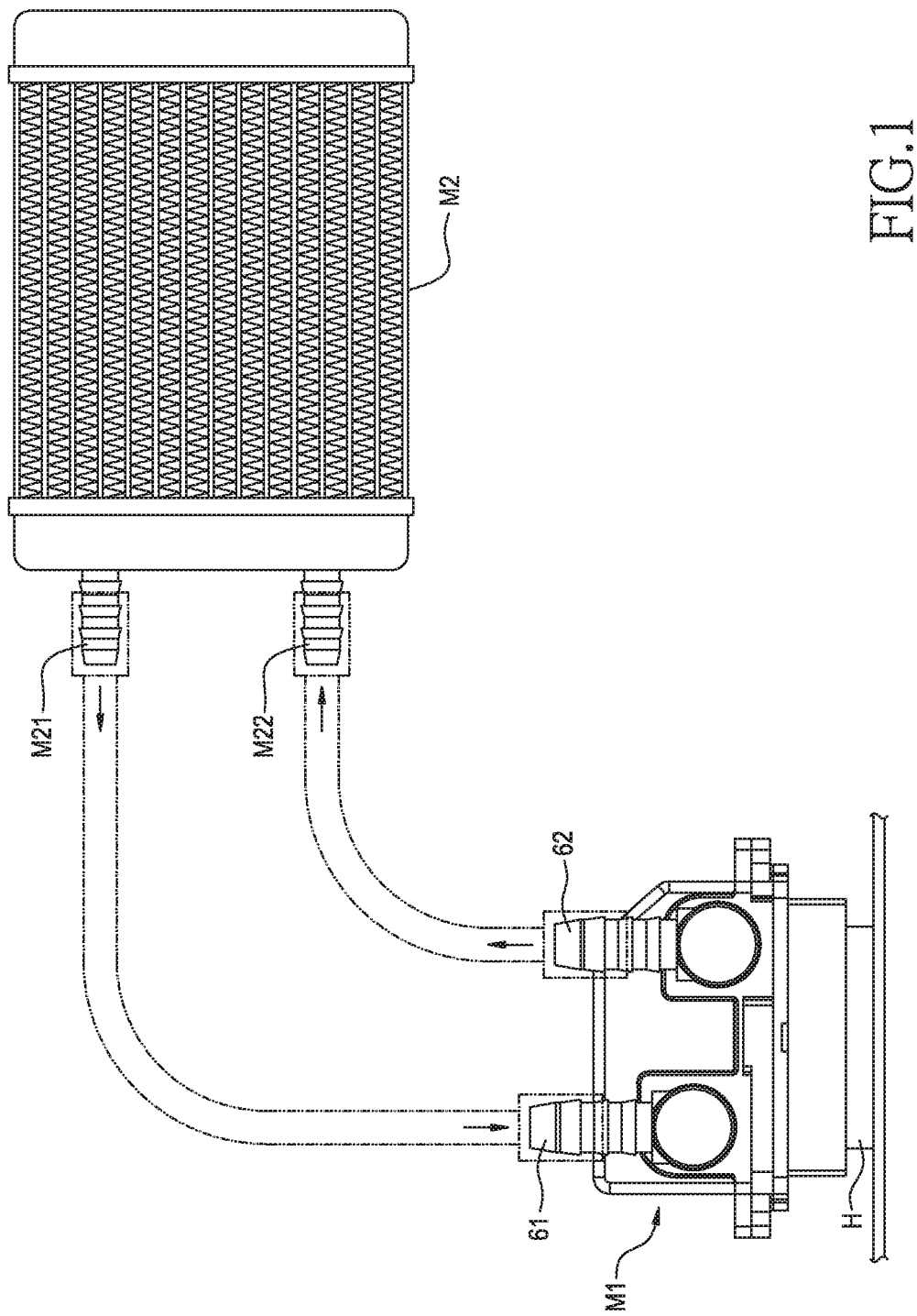
FIG. 1 is a lateral view of a liquid cooling heat sink device in accordance with the present invention.
Figure 2A:
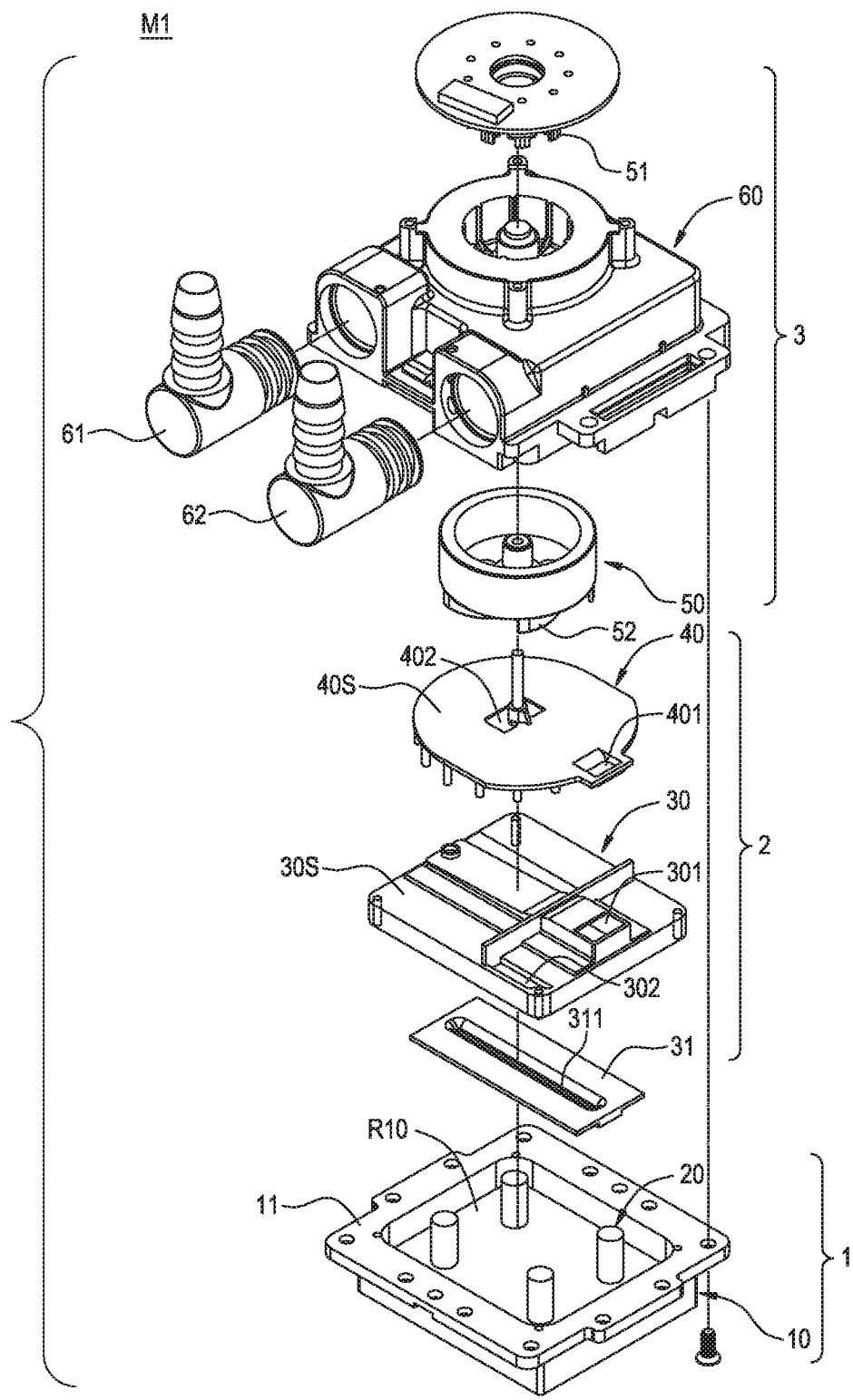
FIG. 2A is an exploded view of the liquid cooling heat sink device in FIG. 1.
Figure 2B:
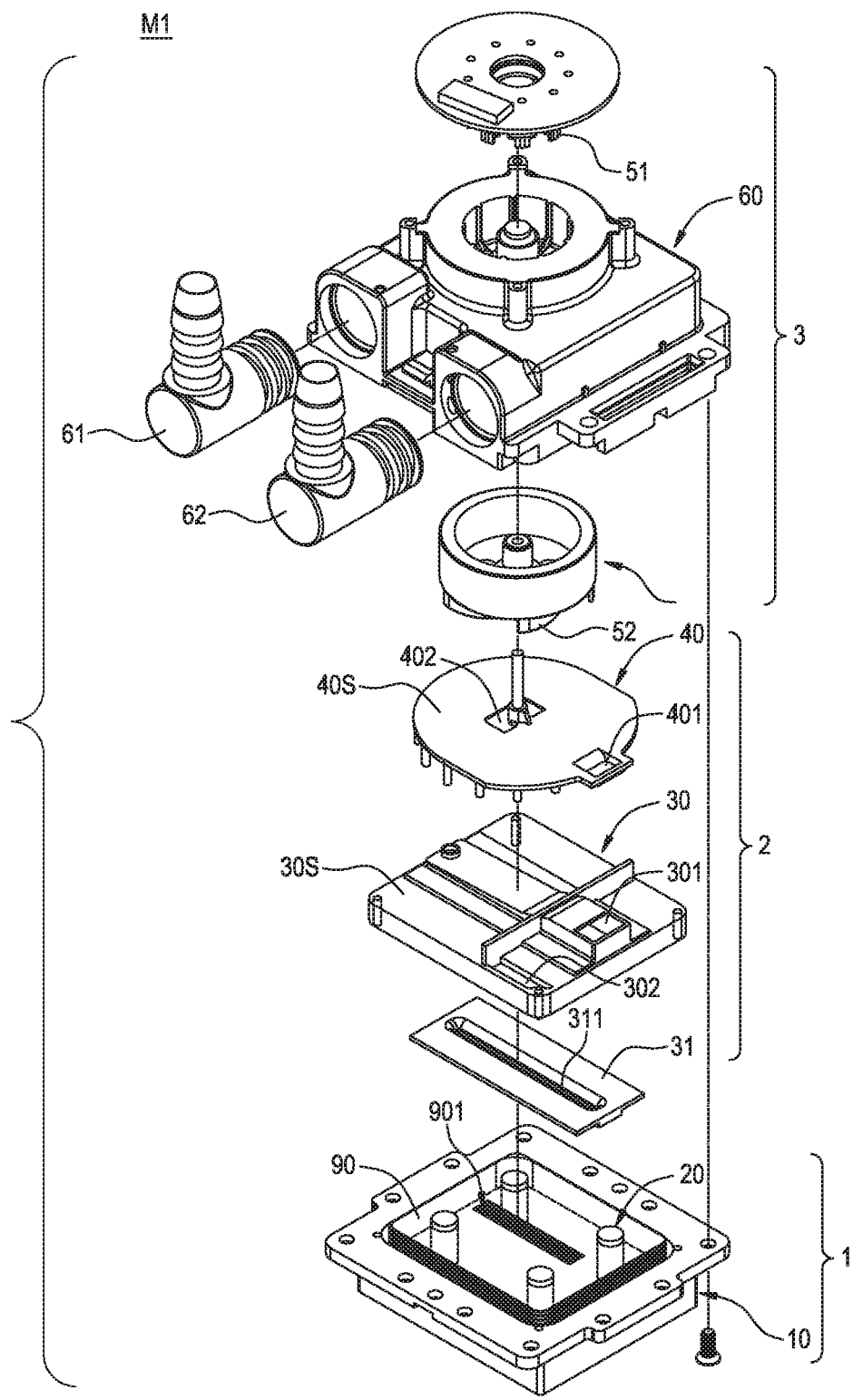
FIG. 2B is an exploded view from one side of the liquid cooling heat sink device in FIG. 1, shown with fins.
Figure 3:
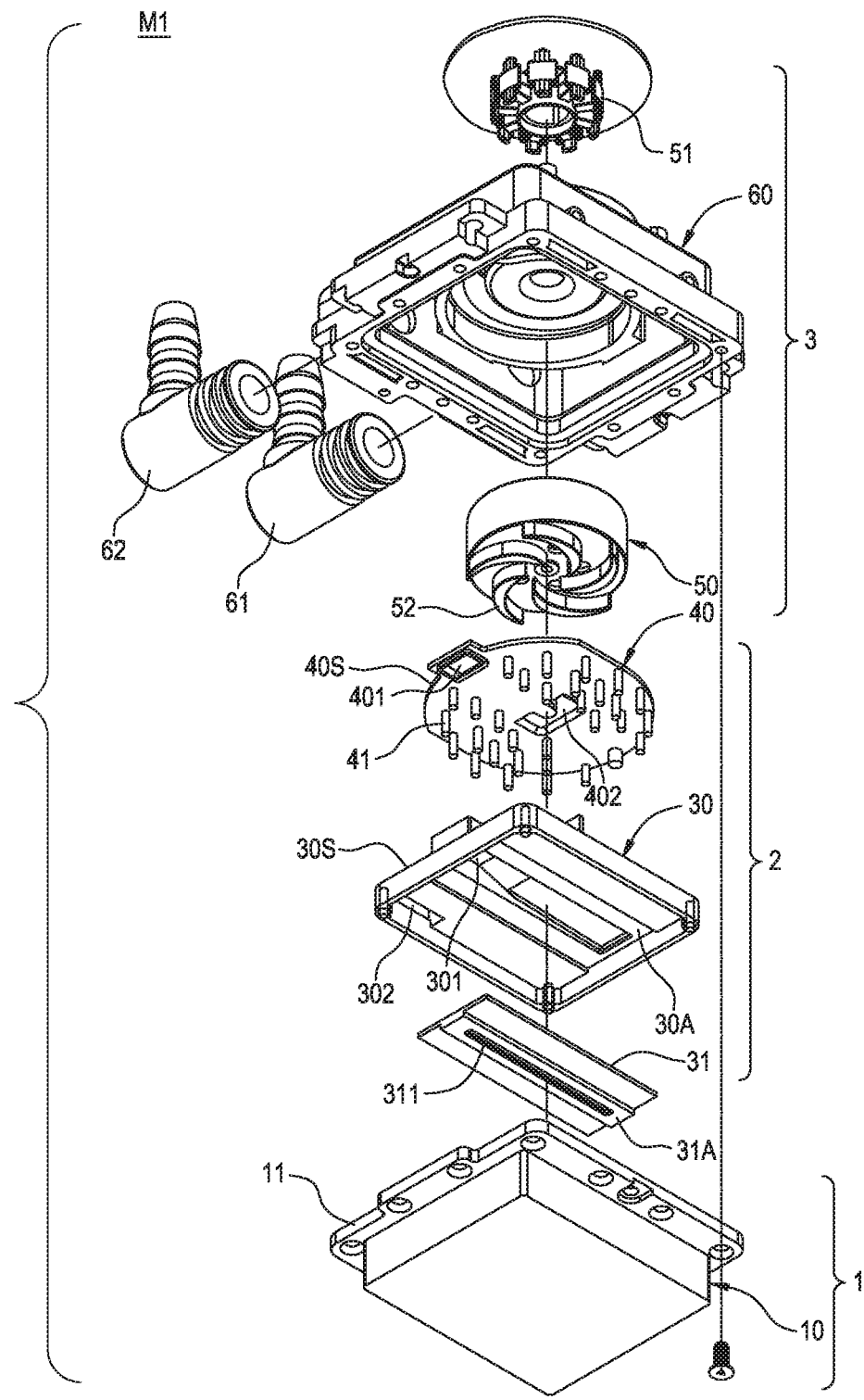
FIG. 3 is an exploded view from another side of the liquid cooling heat sink device in FIG. 1.
Figure 4:
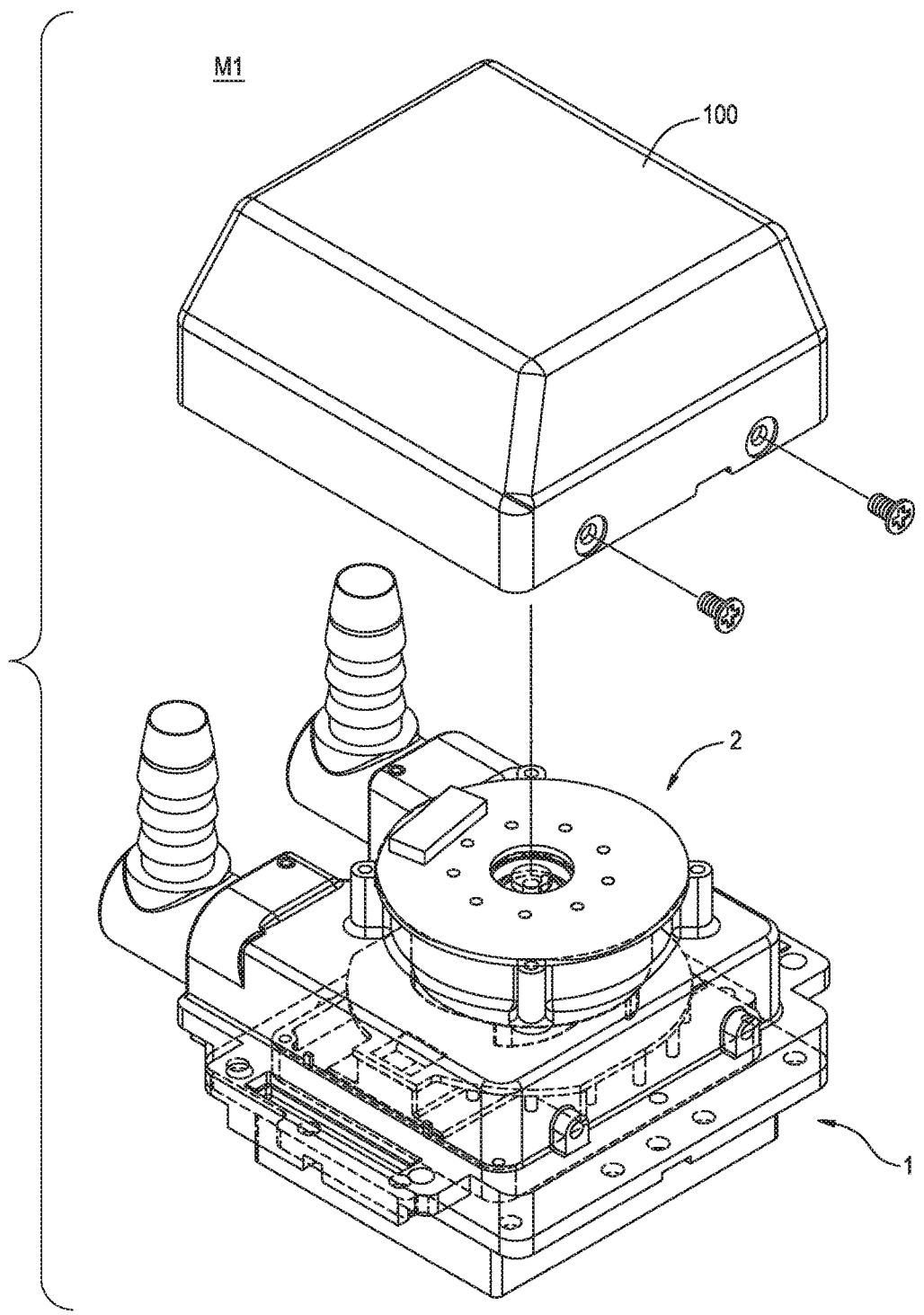
FIG. 4 is a perspective view from one side of the liquid cooling heat sink device in FIG. 1.
Figure 5:
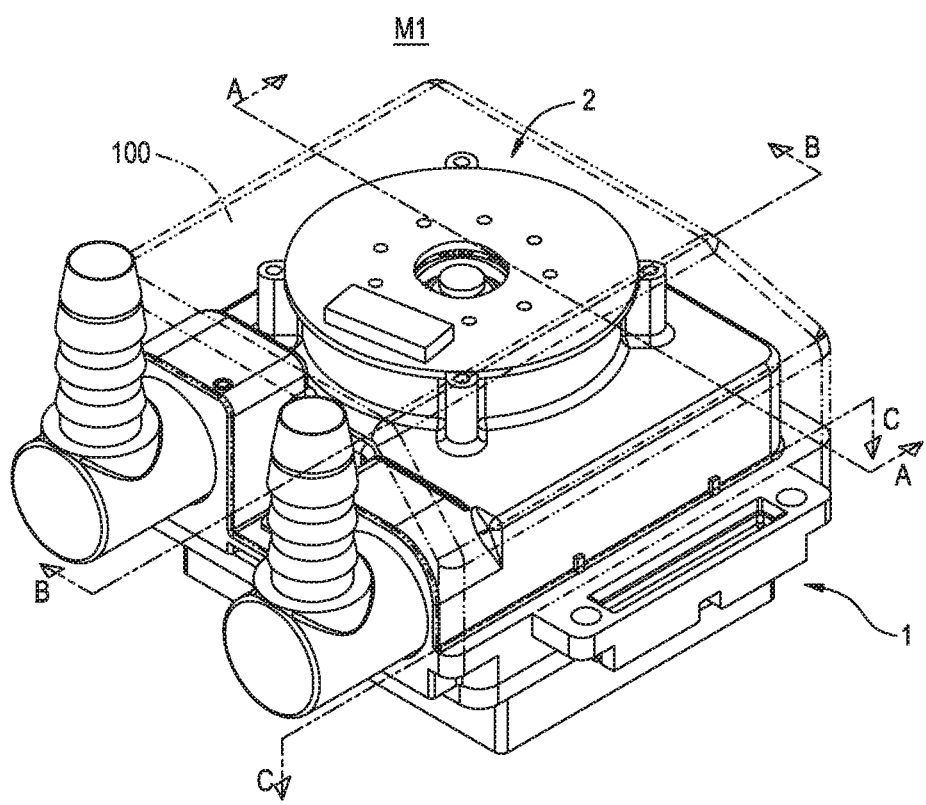
FIG. 5 is a perspective view from another side of the liquid cooling heat sink device in FIG. 1.
Figure 8:
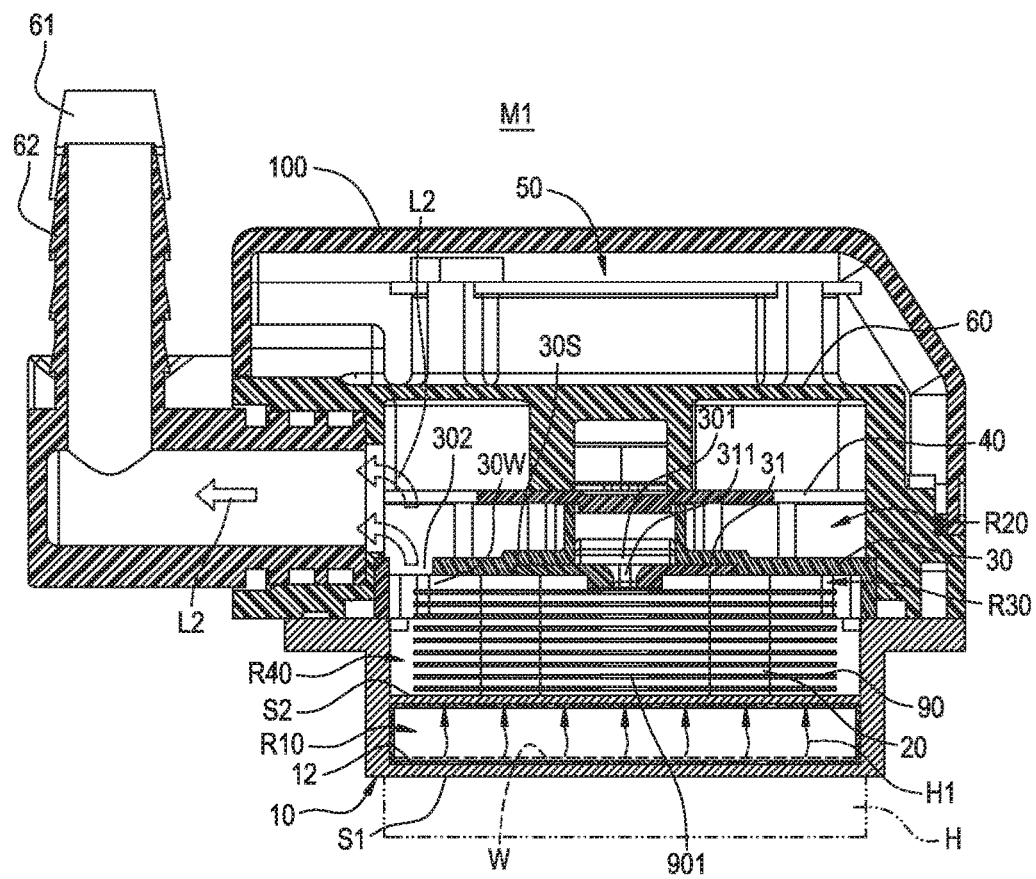
FIG. 8 is a sectional view across line B-B in FIG. 5.

The heat conduction module 1 includes a vapor chamber 10 and a heat conducting column 20 as shown in FIG. 2A, and further may include fins 90 as shown in FIG. 2B. The fins 90 may be sheets with holes for the fins to be serially connected on the heat conducting column 20. The means of the connection is that the heat conducting column 20 and the fins 90 are tightly abutted or welded together. Each one of the fins 90 comprises a slot 901, and the slot 901 is formed through the sheet and a location of each slot 901 corresponds to an aforementioned confluence opening 311, which forms a passage for a coolant L1 as shown in FIGS. 2B and 8, but it is not limited thereto. Detailed description about the fins 90 will be disclosed as follows.

Accordingly, the vapor chamber 10 comprises at least one space R10 and a capillary layer 12 on walls of the vapor chamber 10. A working fluid W flows in the space. One side of the vapor chamber 10 (i.e. a heated surface S1) contacts a heat source H, e.g. CPU or other electronic components. The working fluid W from the heat source H to the space R10 forms an upward thermal convection H1. Another side of the vapor chamber 10 (i.e. a heat-dissipating surface S2) form flanges 11. The flanges 11 are located around the vapor chamber 10. Each one of the flanges 11 extends upward from the vapor chamber 10 and comprises a plurality of holes. The extending portions and the heated surface S2 form a receiving space R40. The heat conducting column 20 is disposed on and coupled with one side of the vapor chamber 10 that is distal from the heat source (i.e. heat-dissipating surface S2). Preferably, there are multiple heat conducting columns 20. The multiple heat conducting columns 20 are parallel and separate from each other on the heat-dissipating surface S2 of the vapor chamber 10. The number of the heat conducting columns 20 is four in the drawings, but it is not limited thereto. Furthermore, a material of the vapor chamber 10 may be selected from aluminum, copper, or graphite. Precisely, the multiple heat conducting columns 20 may be staggered and spaced from each other but be upright on the heat-dissipating surface S2 of the vapor chamber 10. The multiple heat conducting columns 20 are parallel and separate from each other in the drawings, but it is not limited thereto.

Accordingly, the heat conducting column 20 may be a solid column, for example, a round column, square column, a cone, etc. A material of the heat conducting column 20 may be aluminum, copper, graphite, or an alloy thereof. Besides, each one of the heat conducting columns 20 may be a heat pipe extending from the heat-dissipating surface S2 of the vapor chamber 10. Detailed description of various embodiments about the heat conducting column 20 will be disclosed as follows.

The liquid supply module 3 includes a pump 50 and a casing 60. The liquid supply module 3 is detachably mounted on the vapor chamber 10 via screws mounted through the holes of the flange 11 of the vapor chamber 10. The casing 60 comprises a liquid entrance terminal 61 and a liquid exit terminal 62 on an outer side of the casing 60. The pump 50 includes a rotor 52 and a stator 51, the rotor 52 and the stator 51 are detachably mounted between the casing 60 and the liquid guiding module 2, and the stator 51 corresponds to the rotor 52, though in the drawings the liquid entrance terminal 61 and the liquid exit terminal 62 are disposed on the same side of the casing 60.

The liquid guiding module 2 is detachably mounted between the casing 60 and the vapor chamber 10. The liquid guiding module 2 includes a liquid guiding plate 40 and a diversion plate 30. The diversion plate 30 is disposed between the liquid guiding plate 40 and the vapor chamber 10 and covers the heat conducting column 20. The diversion plate 30 comprises a first branch opening 301 and a second branch opening 302. The first branch opening 301 and the second branch opening 302 are disposed on the same side of the diversion plate 30, but it is not limited thereto. The diversion plate 30 comprises a cavity portion 30A to be engaged by a confluence plate 31. The cavity portion 30A is formed on one side of the diversion plate 30, and said side is adjacent to the heat-dissipating surface S2. The confluence plate 31 comprises a confluence opening 311 communicating with the receiving space R40 and the first branch opening 301. The second branch opening 302 communicates with the liquid exit terminal 62. The confluence plate 31 comprises a protrusion 31A. The protrusion 31A is located on one side of the confluence plate 31, and said side is adjacent to the heat-dissipating surface S2. A surrounding wall of the confluence opening 311 forms a curved surface from a top surface of the confluence plate 31 to a bottom surface of the protrusion 31A. Besides, the diversion plate 30 comprises a retaining wall 30W and a cover portion 30S. The retaining wall 30W abuts on a surrounding wall of the vapor chamber 10 and extends upward and thus the receiving space R40 is formed therein. The cover portion 30S is connected to the retaining wall 30W and covers the heat conducting columns 20. The first branch opening 301 forms through the cover portion 30S, and the second branch opening 302 forms through the cover portion 30S and near the retaining wall 30W. Furthermore, a material of the diversion plate 30 and the confluence plate 31 may include aluminum, copper, or graphite. Heat generated by the heat source H may be transmitted to the cover portion 30S via the retaining wall 30W, so that the overall heat sink efficiency thereof can be increased through the material of the diversion plate 30.

Figure 6:
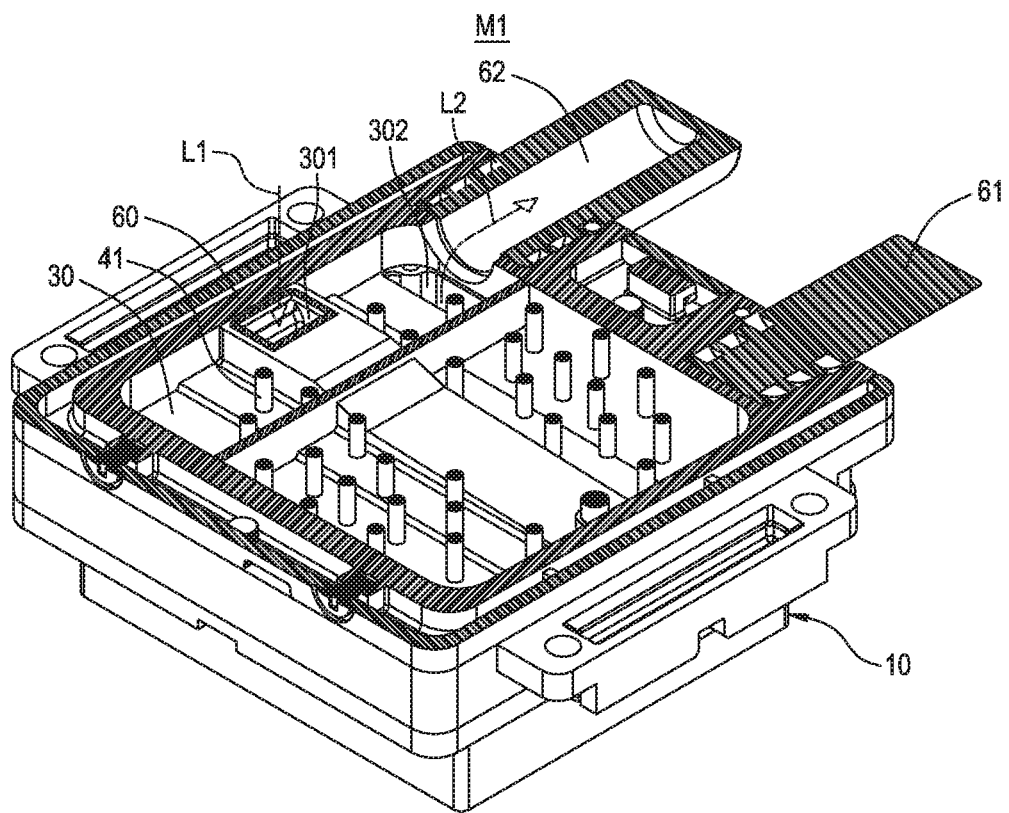
FIG. 6 is a sectional view across line C-C in FIG. 5.
Figure 7:
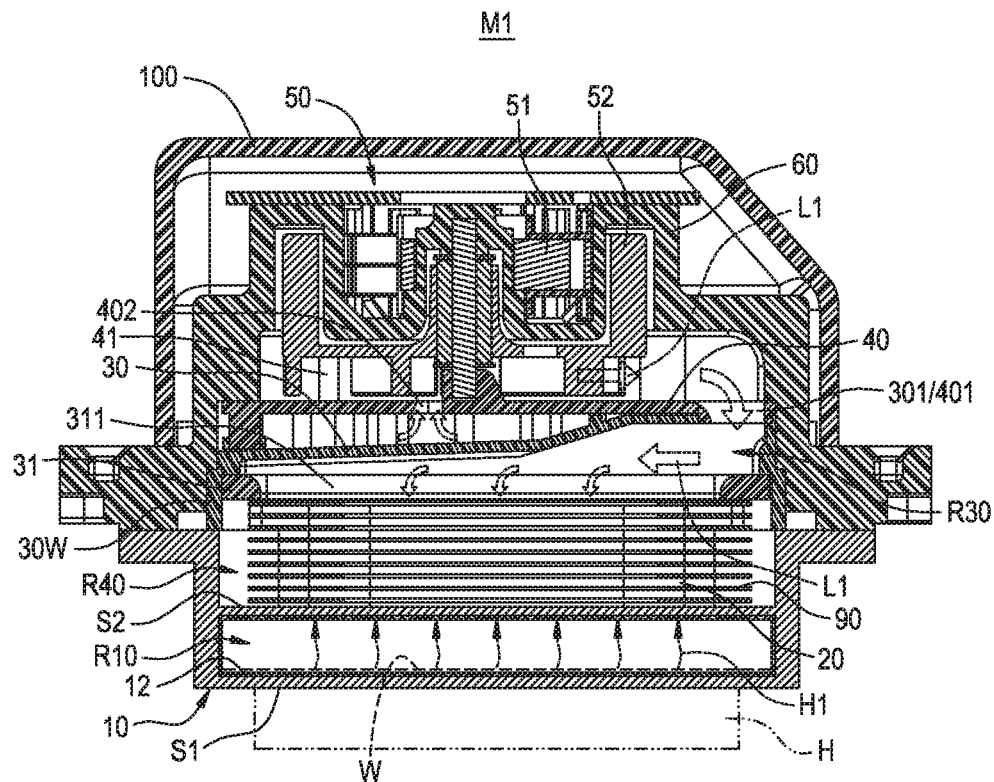
FIG. 7 is a sectional view across line A-A in FIG. 5.

Accordingly, please refer to FIGS. 6 to 8. The liquid guiding plate 40 is disposed on the diversion plate 30 and comprises a first conducting opening 401, a second conducting opening 402, and a plurality of top columns 41. The top columns 41 are located on one side of the liquid guiding plate 40 and said side is adjacent to the diversion plate 30. The top columns 41 abut the cover portion 30S of the diversion plate 30 and thus a first conducting space R20 is formed therein. The first conducting space R20 communicates with the first conducting opening 401 and the second conducting opening 402. Besides, one side of the diversion plate 30 near the heat-dissipating surface S2 forms a second conducting space R30 for communicating with the first conducting opening 401 and the first branch opening 301. The first conducting space R20, the second conducting space R30, and the receiving space R40 communicate with one another. Furthermore, a material of the liquid guiding plate 40 may be selected from at least aluminum, copper, or graphite.

Accordingly, each one of the top columns 41 may be a round column, a round cone, a square column, a polygonal pyramid, or a polygonal column, and may be a solid column or a hollow column. In addition, outer diameters of the top columns 41 may be equal or unequal, but it is not limited thereto and may be designed in accordance with actual demand. The top plate 40S forms a plurality of holes (not shown in the drawings) on a corresponding side thereof for engaging the top columns 41 and thereby the top columns are coupled within the holes of the top plate 40S firmly. In addition, a material of the liquid guiding plate 40 and the top column 41 may be selected from at least aluminum, copper, or graphite. The heat transmitted from the heat source H to the cover portion 30S of the diversion plate 30 may be transmitted evenly to the top plate 40S of the liquid guiding plate 40 via the top columns 41. The overall heat sink efficiency thereof can be increased through the material of the liquid guiding plate 40.

Figure 9A:
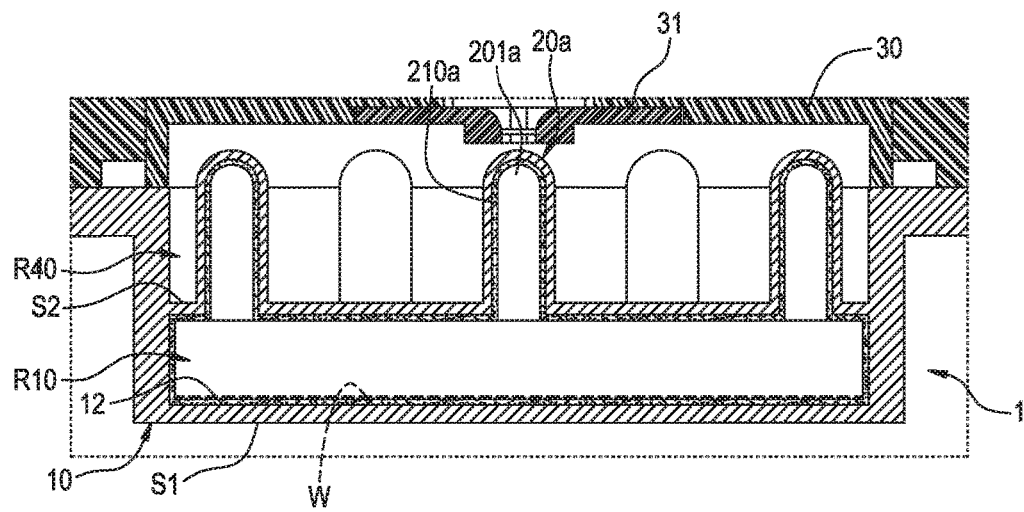
FIG. 9a is a sectional view of a first embodiment of a heat conducting column.

Please refer to FIG. 9a. The present invention provides a first embodiment of the heat conducting column 20. Though the drawings show a structure of the hollow heat pipe, it is just an example and the present invention is not limited thereto. In the present invention, the vapor chamber 10 of the heat conduction module 1 comprises a plurality of heat pipes 20a, the heat pipes 20a are located in the heat-dissipating surface S2 and staggered and separate from one another uprightly, but it is not limited thereto and may be multiple heat pipes 20a parallel and separate from one another uprightly. One side of each one of the heat pipes 20a that is distal from the heat-dissipating surface S2 does not contact the diversion plate 30 or the confluence plate 31. An end surface of said side of each one of the heat pipes 20a may have a planar contour, a stepped contour, an arc-shaped contour, or a curved contour. Though the drawings show the heat pipes 20a with the arc-shaped contour, it is not limited thereto. The heat pipe 20a comprises a chamber 201a and the chamber 201a communicates with the space R10 of the vapor chamber 10. The chamber 201a of each one of the heat pipes 20a forms a capillary layer 210a on a wall of the chamber 201a and the capillary layer 210a and the capillary layer 12 of the space R10 of the vapor chamber 10 are connected to each other. The capillary layer (12, 210a) of the vapor chamber 10 and the heat pipes 20a may have a mesh structure, a fiber texture, a sintered powder structure, or a groove structure. A material of the heat pipes 20 may be selected from at least aluminum, copper, or graphite.

Figure 9B:
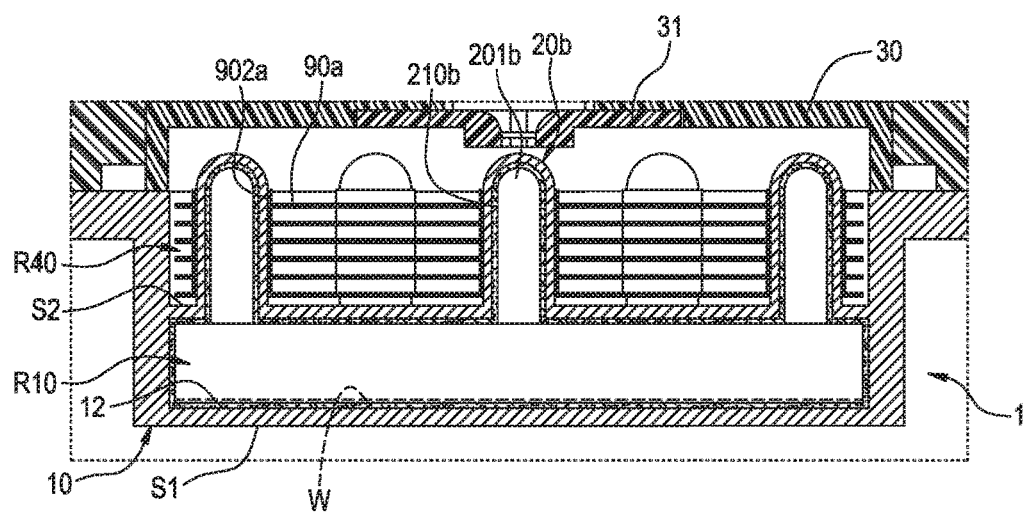
FIG. 9b is a sectional view of a second embodiment of the heat conducting column.
Figure 9C:
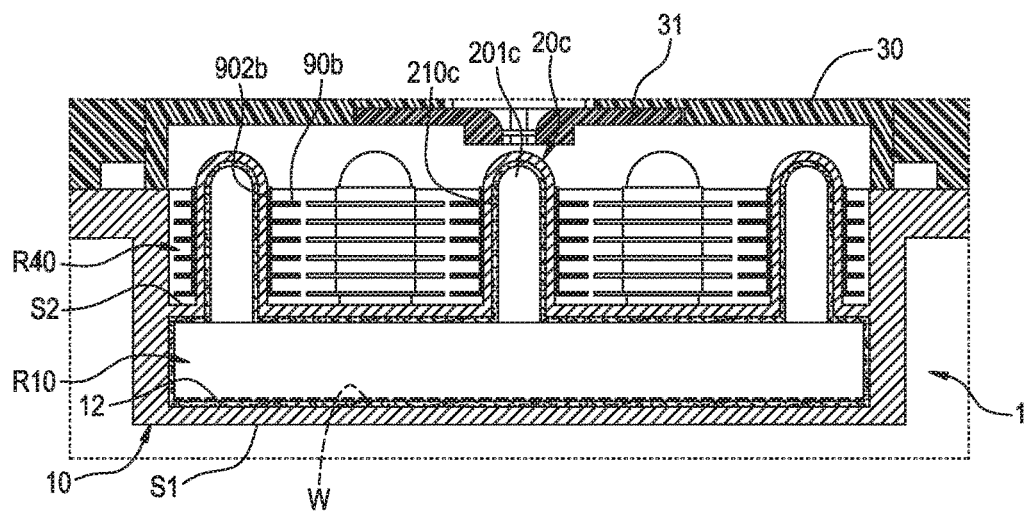
FIG. 9c is a sectional view of a third embodiment of the heat conducting column.

Please refer to FIGS. 8 and 9b. The present invention provides a second embodiment of the heat conducting column 20. Though the drawings show a structure of the hollow heat pipe, it is just an example and the present invention is not limited thereto. Differences of the heat pipe 20a between the second embodiment and the first embodiment are described hereinafter. Each one of the heat pipes 20b comprises a chamber 201b. Each chamber 201b communicates with the space R10 of the vapor chamber 10 and the heat pipe 20b forms a capillary layer 210b on a wall of the chamber 201b. The capillary layer 210b and the capillary layer 12 of the space R10 of the vapor chamber 10 are connected to each other. Each one of the fins 90a comprises at least one hole 902a. The at least one hole 902a is arranged according to an arrangement of the multiple heat pipes 20b, so that the fins 90 are sleeved on and serially connected by an outer wall of the heat pipe 20b. The means of connection of the heat pipes 20b and the fins 90a is that the heat pipe 20b and the fins 90 are tightly abutted or welded together. Furthermore, each one of the fins 90a comprises a slot 901 formed through the fin 90a and corresponding to the confluence opening 311, and thereby the slots 901 of the fins 90a form a passage of the coolant L1. Furthermore, a material of the fins 90a may be selected from at least aluminum, copper, or graphite. Please refer to FIG. 9c. The present invention provides a third embodiment of the heat conducting column 20. Though the drawings show a structure of the hollow heat pipe, it is just an example and the present invention is not limited thereto. The differences of the heat pipe (20a, 20b) and the fins 90a between this embodiment and the first and the second embodiments are described hereinafter. Each one of the heat pipes 20c comprises a chamber 201c. The chamber 201c communicates with the space R10 of the vapor chamber 10 and a wall of the chamber 201c of the heat pipe 20c forms a capillary layer 210c. The capillary layer 210c and the capillary layer 12 of the space R10 of the vapor chamber 10 are connected to each other. An outer wall of each one of the heat pipes 20c is mounted with a plurality of fins 90b. Each one of the fins 90b forms a hole 902b, so that the fins 90b are sleeved on and serially connected by the outer wall of the heat pipe 20c and are separate from each other. Furthermore, one end of each one of the fins 90b is a free end (not shown in the drawings), and said end is distal from the heat pipe 20c. Another end of each one of the fins 90b is a fixed end. The free ends of the fins 90b mounted on the heat pipe 20c do not contact each other. Lengths between the free end and fixed ends of the fins 90b may be equal or unequal, and it is not limited thereto.

Figure 9D:
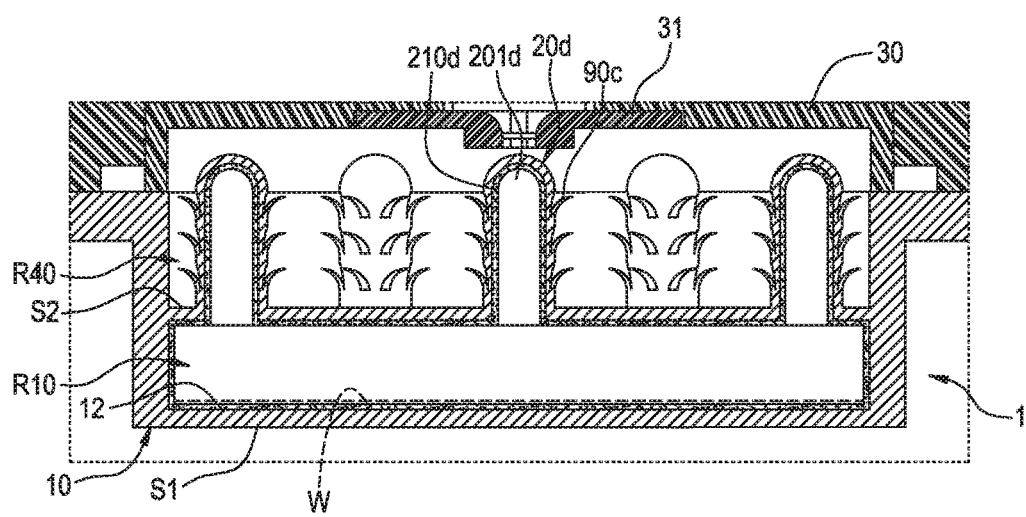
FIG. 9d is a sectional view of a fourth embodiment of the heat conducting column.

Please refer to FIG. 9d. The present invention provides a fourth embodiment of the heat conducting column 20. Though the drawings show a structure of the hollow heat pipe, it is just an example and the present invention is not limited thereto. Differences of the heat pipes (20a, 20b, 20c) and the fins (90a, 90b) of this embodiment and the first, the second, and the third embodiments are described hereinafter. A plurality of heat pipes 20d each comprises a chamber 201d. The chamber 201d communicates with the space R10 of the vapor chamber 10. A wall of the chamber 201d of each one of the heat pipes 20d forms a capillary layer 210d, and the capillary layer 210d and the capillary layer 12 of the space R10 of the vapor chamber 10 are connected to each other. The fins 90c are a plurality of slices. The slices are made from cutting the outer wall of the heat conducting columns 20 and thus the slices extend outward from the heat conducting columns 20 and form at least one bent portion, e.g. forming a curved shape or wave shape. Therefore, heat resistances between the fins 90 and the heat conducting columns 20 are decreased.

Accordingly, the fins (90a, 90b, 90c) in aforesaid embodiments of the present application may be applied to the solid heat conducting columns 20 and are not limited by arrangements of the heat pipes (20a, 20b, 20c, 20d). In addition, geometric structures of the heat pipes (20a, 20b, 20c, 20d) and the chambers (201a, 201b, 201c, 201d) in aforesaid embodiments of the present application may be the same or different in outer diameter, inner diameter, thickness of walls, length of pipes, etc., but it is not limited thereto. Geometric structures of the capillary layers (210a, 210b, 210c, 210d) in aforesaid embodiments of the present application may be the same or different in thickness, porosity, etc.

Please refer to FIGS. 1 and 5 to 8. In the present application, the casing 60 of the heat sink device M1 comprises a shell 100, and the shell 100 is fixed to the casing 60 for decreasing noise during operation of the pump 50. When the heat generated by the heat source H is conducted and convected to the heat-dissipating surface S2 of the vapor chamber 10, the heat conducting columns 20, the fins 90, the diversion plate 30, and the liquid guiding plate 40, with the heat sink device M1 connected outward to a condenser M2, the liquid entrance terminal 61 and the liquid exit terminal 62 of the casing 60 are connected respectively to a circulating outlet M22 and a circulating inlet M21 out of the condenser M2, the coolant L1 is conducted into the casing 60 via the liquid entrance terminal 61 by operation of the rotor 52 of the pump 50, and the coolant L1 is conducted into the first conducting space R20, the second conducting space R30, and into the receiving space R40 through the slot 901 after converged, the coolant L1 absorbs the heat conducted and convected to the heat-dissipating surface S2 of the vapor chamber 10, the heat conducting columns 20, the fins 90, the diversion plate 30, and the liquid guiding plate 40. A coolant L2 absorbing heat is conveyed to the condenser M2 via the second branch opening 302 and the liquid exit terminal 62, and then is cooled and becomes the coolant L1 and the aforementioned processes are repeated. The working fluid W in the space R10 of the vapor chamber 10 and the coolant L1 in the casing 60 form multiple cooling circulating paths, which enhances the overall heat sink efficiency.

Consequently, the liquid cooling heat sink device of the present invention can achieve an intended purpose and solve the defect of the prior art. Because of the novelty, inventive step, and full compliance with the requirements of applying for an invention patent, an application for a patent is filed according to the patent law. Please examine and grant the application as a patent to protect the rights of the inventor.

The invention claimed is:

1. A liquid cooling heat sink device for cooling a heat source, the liquid cooling heat sink device characterized in that the liquid cooling heat sink device comprises: a heat conduction module, a liquid guiding module, and a liquid supply module, wherein:
   the heat conduction module includes:
      a vapor chamber comprising at least one space; one side of the vapor chamber contacting the heat source; a working fluid flowing in the space; and
      at least one heat conducting column mounted on another side of the vapor chamber and said another side of the vapor chamber distal from the heat source;
   the liquid supply module is mounted on one side of the vapor chamber; the liquid supply module includes:
      a casing comprising:
         a liquid entrance terminal and a liquid exit terminal out of the casing; and
      a pump;
   the liquid guiding module is mounted on one side of the vapor chamber and forming:
      a receiving space between the liquid guiding module and the vapor chamber;
   wherein the liquid supply module communicates with the receiving space for guiding a coolant to the receiving space and discharging the coolant via the liquid exit terminal.

2. The liquid cooling heat sink device as claimed in claim 1, wherein the at least one heat conducting column comprises multiple heat conducting columns, and the multiple heat conducting columns are parallel and separate from one another uprightly or staggered and separate from one another uprightly.

3. The liquid cooling heat sink device as claimed in claim 2, wherein the heat conducting columns are solid columns.

4. The liquid cooling heat sink device as claimed in claim 2, wherein the heat conducting columns are heat pipes extending from one side of the vapor chamber; each one of the heat pipes comprises:
   a chamber communicating with the space of the vapor chamber and forming:
   a capillary layer on a wall of the chamber.

5. The liquid cooling heat sink device as claimed in claim 4, wherein a capillary layer on a wall of the space is connected with the capillary layer on the wall of the chamber.

6. The liquid cooling heat sink device as claimed in claim 4, wherein the capillary layer is selected from the group consisting of a mesh structure, a fiber texture, a sintered powder structure, and a groove structure.

7. The liquid cooling heat sink device as claimed in claim 1, wherein a plurality of fins is mounted to the heat conducting column.

8. The liquid cooling heat sink device as claimed in claim 7, wherein a material of each one of the fins includes at least aluminum, copper, or graphite.

9. The liquid cooling heat sink device as claimed in claim 7, wherein the fins are serially connected and fixed on the heat conducting column and each one of the fins comprises:
   a slot.

10. The liquid cooling heat sink device as claimed in claim 7, wherein each one of the fins is a slice formed on an outer wall of the heat conducting column and extending outward from the outer wall of the heat conducting column.

11. The liquid cooling heat sink device as claimed in claim 1, wherein the liquid entrance terminal and the liquid exit terminal are located on the same side of the casing.

12. The liquid cooling heat sink device as claimed in claim 1, wherein the liquid entrance terminal and the liquid exit terminal are connected to an external circulating outlet and a circulating inlet of a condenser, and thereby a cooling circulation is formed.

13. The liquid cooling heat sink device as claimed in claim 1, wherein the liquid guiding plate comprises:
   a plurality of top columns engaged on one side of the liquid guiding plate, and said side of the liquid guiding plate being adjacent to one side of the diversion plate; each one of the top columns being a solid round column, a solid cone, a solid rectangular prism, a solid polygonal pyramid, a solid polygonal prism, a hollow round column, a hollow cone, a hollow rectangular prism, a hollow polygonal pyramid, or a hollow polygonal prism.

14. The liquid cooling heat sink device as claimed in claim 13, wherein outer diameters of the top columns are equal or unequal.

15. The liquid cooling heat sink device as claimed in claim 13, wherein materials of the vapor chamber, the heat conducting column, the liquid guiding plate, and the diversion plate include at least aluminum, copper, or graphite.

16. The liquid cooling heat sink device as claimed in claim 1, wherein:
   the liquid guiding module includes a liquid guiding plate and a diversion plate;
   the diversion plate is mounted between the liquid guiding plate and the vapor chamber and covers the heat conducting column;
   a receiving space is formed between a side of the vapor chamber and the diversion plate, said side of the vapor chamber being distal from the heat source;
   a first conducting space is formed between the liquid guiding plate and the casing;
   a second conducting space is formed between the diversion plate and the liquid guiding plate;
   wherein the liquid entrance terminal, the first conducting space, the second conducting space, the receiving space, and the liquid exit terminal communicate with each other.

17. The liquid cooling heat sink device as claimed in claim 16, wherein the liquid cooling heat sink device further includes:
   a confluence plate engaged on one side of the diversion plate, said side of the diversion plate being adjacent to the vapor chamber and comprising:
   a confluence opening communicating with the receiving space.

* * * * *